(12) United States Patent
Kuekes et al.

(10) Patent No.: US 6,314,019 B1
(45) Date of Patent: Nov. 6, 2001

(54) MOLECULAR-WIRE CROSSBAR INTERCONNECT (MWCI) FOR SIGNAL ROUTING AND COMMUNICATIONS

(75) Inventors: Philip J. Kuekes, Menlo Park; R. Stanley Williams, Mountain View; James R. Heath, Santa Monica, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/280,225

(22) Filed: Mar. 29, 1999

(51) Int. Cl.$^7$ .................................................. G11C 11/00

(52) U.S. Cl. ............................ 365/151; 365/153; 365/175

(58) Field of Search ................................. 716/1; 365/151, 365/148, 103, 114, 115, 175, 153

(56) References Cited

U.S. PATENT DOCUMENTS

| | | | |
|---|---|---|---|
| 3,975,623 | 8/1976 | Weinberger | 235/152 |
| 4,208,728 | 6/1980 | Blahut et al. | 365/154 |
| 5,475,341 | 12/1995 | Reed | 327/566 |
| 5,519,629 | 5/1996 | Snider | 364/490 |
| 5,589,692 * | 12/1996 | Reed | 257/23 |
| 5,640,343 | 6/1997 | Gallagher et al. | 365/171 |
| 5,729,752 | 3/1998 | Snider et al. | 395/800 |
| 5,790,771 | 8/1998 | Culbertson et al. | 395/182.01 |
| 6,128,214 * | 10/2000 | Kuekes et al. | 365/151 |
| 6,198,655 * | 3/2001 | heath et al. | 365/151 |

OTHER PUBLICATIONS

J.R. Heath et al, "A Defect–Tolerant Computer Architecture: Opportunities for Nanotechnology", Science, vol. 280, pp. 1716–1721 (Jun. 12, 1998).

L. Guo et al, "Nanoscale Silicon Field Effect Transistors Fabricated Using Imprint Lithography", Applied Physics Letters, vol. 71, pp. 1881–1883 (Sep. 29, 1997).

A.M. Morales et al, "A Laser Ablation Method For The Synthesis Of Crystalline Semiconductor Nanowires", Science, vol. 279, pp. 208–268 (Jan. 9, 1998).

J.R. Heath et al, "A Liquid Solution Synthesis Of Single Crystal Germanium Quantum Wires", Chemical Physics Letters, vol. 208, No. 3, 4, pp. 263–268 (Jun. 11, 1993).

(List continued on next page.)

*Primary Examiner*—David Nelms
*Assistant Examiner*—Thong Le

(57) ABSTRACT

A molecular-wire crossbar interconnect for signal routing and communications between a first level and a second level in a molecular-wire crossbar is provided. The molecular wire crossbar comprises a two-dimensional array of a plurality of nanometer-scale switches. Each switch is reconfigurable and self-assembling and comprises a pair of crossed wires which form a junction where one wire crosses another and at least one connector species connecting the pair of crossed wires in the junction. The connector species comprises a bi-stable molecule. Each level comprises at least one group of switches and each group of switches comprises at least one switch, with each group in the first level connected to all other groups in the second level in an all-to-all configuration to provide a scalable, defect-tolerant, fat-tree networking scheme. The primary advantage is ease of fabrication, because an active switch is formed any time two wires cross. This saves tremendously on circuit area (a factor of a few times ten), since no other wires or ancillary devices are needed to operate the switch or store the required configuration. This reduction of the area of a configuration bit and its switch to just the area of two crossing wires is a major advantage in constructing a defect-tolerant interconnect network.

49 Claims, 4 Drawing Sheets

OTHER PUBLICATIONS

V.P. Menon et al, "Fabrication and Evaluation Of Nanoelectrode Ensembles", Analytical Chemistry, vol. 67, pp. 1920–1928 (Jul. 1, 1995).

L. Guo et al, "A Silicon Single–Electron Transistor Memory Operating At Room Temperature", Science, vol. 275, pp. 649–651 (Jan. 31, 1997).

S.J. Tans et al, "Room–Temperature Transistor Based On A Single Carbon Nanotube", Nature, vol. 393, pp. 49–52 (May 7, 1998).

K.K. Likharev, "Correlated Discrete Transfer Of Single Electrons In Ultrasmall Tunnel Junctions", IBM Journal of Research and Development, vol. 32, No. 1, pp. 144–158 (Jan. 1998).

R.E. Jones Jr., et al, "Ferroelectric Non–Volatile Memories For Low–Voltage, Low–Power Applications", Thin Solid Films, vol. 270, pp. 584–588 (Dec. 1, 1995).

D.B. Amabilino et al, "Aggregation Of Self–Assembling Branched [n]–Rotaxanes", New Journal of Chemistry, vol. 22, No. 9, pp. 959–972 (Sep. 11, 1998).

T. Vossmeyer et al, "Combinatorial Approaches Toward Patterning Nanocrystals", Journal of Applied Physics, vol. 84, No. 7, pp. 3664–3670 (Oct. 1, 1998).

D.V. Leff et al, "Thermodynamic Control Of Gold Nanocrystal Size: Experiment And Theory", The Journal of Physical Chemistry, vol. 99, pp. 7036–7041 (May 4, 1995).

J.D.L. Holloway et al, "Electron–Transfer Reactions Of Metallocenes: Influence Of Metal Oxidation State On Structure And Reacivity", Journal of the American Chemical Society, vol. 101, pp. 2038–2044 (Apr. 11, 1979).

C. Mead et al, "Introduction to VLSI Systems", Addison-Wesley, Ch. 3, Section 10, pp. 79–82 (1980).

* cited by examiner

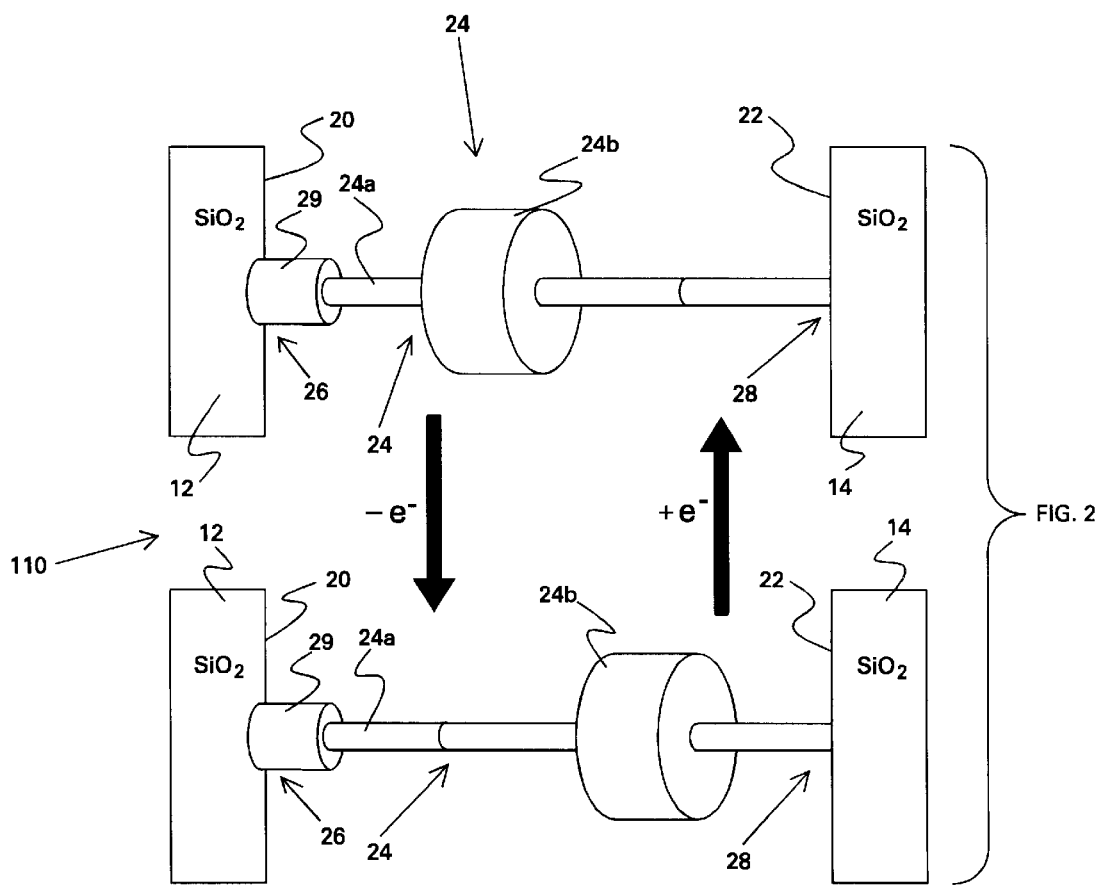

MOLECULAR-WIRE CROSSBAR INTERCONNECT (MWCI) FOR SIGNAL ROUTING AND COMMUNICATIONS

CROSS-REFERENCE TO RELATED APPLICATIONS

The present application is related to the following applications: Ser. No. 09/280,189 ("Molecular Wire Crossbar Memory"), now U.S. Pat. No. 6,128,214, issued Oct. 3, 2000; Ser. No. 09/280,045 ("Molecular Wire Crossbar Logic"); Ser. No. 09/280,049 ("Demultiplexer for a Molecular Wire Crossbar Network"); Ser. No. 09/280,188 ("Molecular Wire Transistors") [PD-10981967-1]; and Ser. No. 09/280,048 ("Chemically Synthesized and Assembled Electronic Devices"), all filed on even date herewith. The present application employs the chemical synthesis and assembly techniques disclosed and claimed in Ser. No. 280,048 and the molecular wire transistors disclosed and claimed in Ser. No. 280,188 and is used in the logic circuits disclosed and claimed in Ser. No. 09/280,045 and memory applications as disclosed and claimed in Ser. No. 09/280, 189.

TECHNICAL FIELD

The present application relates generally to making integrated circuits of electronic devices whose functional length scales are measured in nanometers, and, more particularly, to crossbar interconnects based on crossed nanometer-scale wires joined by bi-stable molecular scale switches at the intersecting junctions.

The silicon (Si) integrated circuit (IC) has dominated electronics and has helped it grow to become one of the world's largest and most critical industries over the past thirty-five years. However, because of a combination of physical and economic reasons, the miniaturization that has accompanied the growth of Si ICs is reaching its limit. The present scale of devices is on the order of tenths of micrometers. New solutions are being proposed to take electronics to ever smaller levels; such current solutions are directed to constructing nanometer-scale devices.

Prior proposed solutions to the problem of constructing nanometer-scale devices have involved (1) the utilization of extremely fine scale lithography using X-rays, electrons, ions, scanning probes, or stamping to define the device components; (2) direct writing of the device components by electrons, ions, or scanning probes; or (3) the direct chemical synthesis and linking of components with covalent bonds. The major problem with (1) is that the wafer on which the devices are built must be aligned to within a small fraction of the size of the device features in at least two dimensions for several successive stages of lithography, followed by etching or deposition to build the devices. This level of control does not scale well as device sizes are reduced to nanometer scale dimensions. It becomes extremely expensive to implement as devices are scaled down to nanometer scale dimensions. The major problem with (2) is that it is a serial process, and direct writing a wafer full of complex devices, each containing trillions of components, could well require many years. Finally, the problem with (3) is that high information content molecules are typically macromolecular structures such as proteins or DNA, and both have extremely complex and, to date, unpredictable secondary and tertiary structures that cause them to twist into helices, fold into sheets, and form other complex 3D structures that will have a significant and usually deleterious effect on their desired electrical properties as well as make interfacing them to the outside world impossible.

The problem of building a physical digital circuit, as opposed to only a set of digital devices, is to connect a set of devices with a physical interconnect which is topologically equivalent to the logical net list of the logic design that is being implemented. The lithographic creation of integrated circuits does this, but at great expense for nanometer-scale objects. Direct write methods using electron or ion beams can create nanometer scale interconnect, but they do so one wire at a time in a serial fashion which is clearly inadequate for wiring a circuit with trillions of components. The use of nanoscale devices means that the ability to fabricate circuits with trillions of components is required.

An intrinsically parallel solution to the problem of creating nanoscale interconnect is to chemically fabricate an extremely regular structure, and then to configure that structure so that the wiring paths through it are determined by a set of programmable configuration bits. This can be done using a crossbar switch. A crossbar is an array of switches that connect each wire in one set of parallel wires to every member of a second set of parallel wires that intersects the first set (usually the two sets of wires are perpendicular to each other, but this is not a necessary condition).

There has only been one published idea about building a crossbar switch using molecular components; see, J. R. Heath, et al, "A Defect-Tolerant computer Architecture: Opportunities for Nanotechnology", *Science*, Vol. 280, pp. 1716–1721 (Jun. 12, 1998). The problem with that idea was that it required making an intimate contact among five different nanometer-scale components: two address wires, two data wires, and a quantum dot.

Contemporary crossbar switches use several transistors to store a configuration bit and control the flow of current between the two data wires. This requires a large area for a circuit, a factor of 20 to 40 times the area of the wire intersection itself, to control the crossbar switch. This heavy penalty in circuit area is one of the major issues limiting the use of crossbar switches and defect tolerant schemes in modern circuits.

Thus, there is a need for providing a physically parallel means of constructing an interconnect for signal routing and communications at nanometer-scale dimensions, that can be used to readily and cheaply form complex circuits and systems from nanometer-scale devices.

DISCLOSURE OF INVENTION

In accordance with the present invention, a molecular-wire crossbar interconnect (MWCI) for signal routing and communications between a first layer of wires and a second layer of wires in a molecular-wire crossbar is provided. The molecular wire crossbar comprises a two-dimensional array of a plurality of nanometer-scale switches. Each switch is either singly configurable or reconfigurable and self-assembling and comprises a junction formed by a pair of crossed wires. The junction is formed where one wire crosses another. At least one connector species connects the pair of crossed wires in the junction.

The electronic switch of the present invention, in one realization, is a quantum-state molecular switch comprising an electrically adjustable tunnel junction between two wires. Only at the intersection of the two wires is an actual device defined. The exact position of this intersection is not important for this architecture. The molecular devices sandwiched between the wires can be electrochemically oxidized or reduced. Oxidation or reduction of the molecule forms the basis of a switch. Oxidation or reduction will effect the tunneling distance or the tunneling barrier height between the two wires, thereby exponentially altering the rate of charge transport across the wire junction. Some types of molecules can be cycled reversibly (reconfigurable), while others will act irreversibly (singly configurable). The chemical state of the molecular switches determines the tunneling resistance between the two wires. Each switch consists of two crossed wires sandwiching an electrically addressable molecular device. The approach is extremely simple and inexpensive to implement, and scales from wire dimensions of several micrometers down to nanometer-scale dimensions. This method requires only a set of bi-stable switches which can control electrical contact between the two layers of wires approximately perpendicular to the two parallel planes defined by the crossbar wires (Z direction).

The above description is directed to controlling connections between layers. Controlling connections within a layer are essential for realizing a practical crossbar. In order to create an arbitrary circuit from a highly ordered set of wires and switches such as a crossbar, it is necessary to make cuts at specific locations to break the electrical continuity along certain wires (in the plane of the crossbar). This enables functions in one part of the regular array of wires and switches to be isolated from those of other parts, and in conjunction with open switches between the two layers of a crossbar allows electrical signals from different finctions to be routed through each other without interfering. Given the fact that the crossbars described herein are made from junctions, which are essentially electrochemical cells, between sets of crossing wires, such cuts can be made by over-oxidizing a particular junction to consume a localized region of the wire to be cut, and thus form an insulating gap that breaks the electrical continuity of that wire at the desired location. Thus, there are at least three different voltage levels (which may be different magnitudes of the same polarity or involve different polarities) utilized in configuring a crossbar into a communications interconnect and using it. The first voltage level is relatively large, and it is used only to over-oxidize a junction to create an electrical break in a wire. The next voltage level is smaller in magnitude, and it is used to oxidize or reduce some or all of the molecules or materials between two wires to open or close a switch and thus disable or enable a particular type of connection between the wires in different levels of the crossbar. Finally, the third voltage is the smallest in magnitude, and that is the voltage level used to actually propagate information through the circuit. The three voltages must be separated enough from each other to avoid unintentional setting of switches or cutting of wires by signal propagation.

In addition, by including switches described in copending patent application Ser. No. 09/280,188 ("Molecular Wire Transistor"), the interconnect can be configured by setting configuration bits which make or break electrical connections along the wires at specific locations to make or break the electrical continuity along certain wires (in the plane of the crossbar). The specific location of the break is determined by the point at which the wire which forms the gate crosses the semiconducting wire which forms the source and drain.

The molecular wire crossbar switch and the resultant crossbar network built from multiple sets of these switches allows the construction of an arbitrarily-designed logic circuit. All of the interconnection required by that logic circuit is at a nanometer scale. In effect, all of the wiring required of a complex integrated circuit can be created by this mechanism without the use of lithography. The present invention enables construction of molecular electronic devices on a length scale that can range from micrometers to nanometers via a straightforward and inexpensive chemical assembly procedure. The device is either partially or completely chemically assembled, and the key to the scaling is that the location of the devices on the substrate are defined once the devices have been assembled, not prior to assembly.

The present invention solves both the fabrication complexity of the previously proposed molecular crossbar by using only two wires, and the problem of "wasted area" of contemporary devices because the only switching components are sandwiched between the wires. This invention also solves the problem of creating a complete "fat-tree" topology (not just individual crossbar switches) without the use of lithography. While U.S. Pat. No. 5,519,629, issued to G. S. Snider on May 21, 1996, and assigned to the same assignee as the present patent shows how to map a fat tree topology onto a plane, it does not show how to do it without integrated circuit lithography.

The primary advantage of the present invention is ease of fabrication, because an active switch is formed any time two wires cross. These switches, which are used to define the interconnection topology of the integrated circuit, are formed by a highly parallel chemical process. This enables formation of trillions of switches in a time no longer than it takes to form thousands of switches.

A second advantage of the present invention is that it saves tremendously on circuit area (a factor of a few times ten), since no other wires or ancillary devices are needed to operate the switch or store the required configuration. This reduction of the area of a configuration bit and its switch to just the area of two crossing wires is a major advantage in constructing a defect tolerant interconnect network; see, U.S. Pat. No. 5,790,771, "Apparatus and Method for Configuring a Reconfigurable Electronic System Having Defective Resources", issued to W. B. Culbertson et al on Aug. 4, 1998, and assigned to the same assignee as the present invention. If the area cost of defect tolerance substantially exceeds that of the interconnect used by the circuit, it becomes prohibitively expensive and the area density advantages of a nanometer-sized technology are lost. The present invention (MWCI) has the major advantage that the increased efficiency in packing configuration bits reduces the cost of defect tolerance (making it essentially free in terms of circuit area) for precisely those components (molecular scale devices and wires) that might require defect tolerance in order to be used at all.

Finally, since only two wires are needed to address and set the switches which define the integrated circuit being constructed, and since the switch itself is defined not by high resolution lithographic templating, but rather by the relatively arbitrary intersection of two wires, the fabrication process for these integrated circuits is substantially simpler and tolerant of manufacturing deficiencies than is the current art.

BRIEF DESCRIPTION OF THE DRAWINGS

FIG. 2 is a schematic representation of two crossed nanowires, joined by a rotaxane, and depicting the two bi-stable states;

BEST MODES FOR CARRYING OUT THE INVENTION

Definitions

Figure 1A:
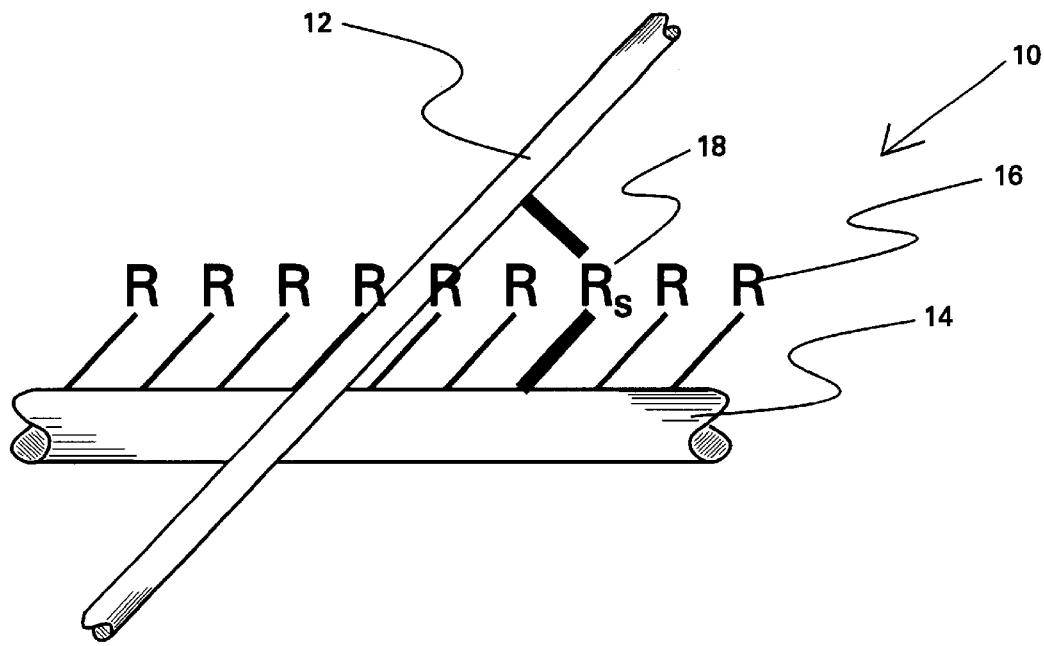
FIG. 1A is a schematic representation of two crossed nano-scale wires, with at least one molecule bridging the gap in accordance with the invention.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read only memory (PROM), for example.

The term "reconfigurable" means that a switch can change its state multiple times via a reversible process such as an oxidation or reduction; in other words, the switch can be opened and closed multiple times such as the memory bits in a random access memory (RAM).

The term "bi-stable" as applied to a molecule means a molecule having two relatively low energy states. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.04 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 1 to 10 micrometers, heights that can range from a few tens of nanometers to a micrometer, and lengths of several micrometers and longer.

A crossbar is an array of switches that connect each wire in one set of parallel wires to every member of a second set of parallel wires that intersects the first set (usually the two sets of wires are perpendicular to each other, but this is not a necessary condition).

Crossed Wire Switch

In related patent application Ser. No. 09/280,048, filed on even date herewith, a basic scheme for chemically synthesized and assembled electronic devices is provided. That application discloses and claims a quantum state switch, which comprises an adjustable tunnel junction between two nanometer-scale wires. In accordance with that invention, an electronic device is provided, comprising two crossed wires having nanometer dimensions, provided with functionalizing groups that control conductivity type of the wires. A plurality of such crossed wires may be assembled to provide a variety of different devices and circuits.

That invention enables the construction of electronic devices on a nanometer scale using relatively stiff wires that are chemically functionalized to provide the desired electronic properties and which are then chemically-assembled to create active electronic devices simply by forming contact with other wires.

Figure 1B:
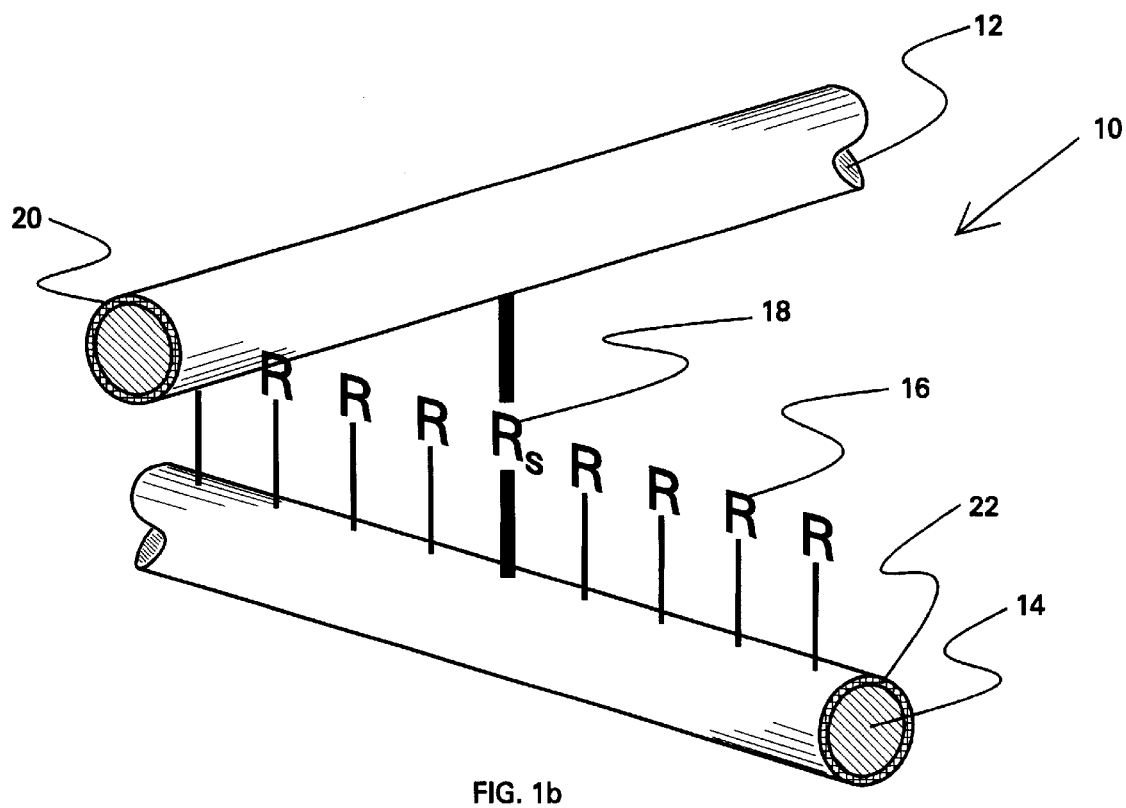
FIG. 1B is a perspective view, depicting the device shown in FIG. 1A.

The essential device features are shown in FIGS. 1A–1B. A crossed wire switch 10 comprises two wires 12, 14, each either a metal or semiconductor wire, that are crossed at some non-zero angle. In between those wires is a layer of molecules or molecular compounds 16, denoted R in FIGS. 1A and 1B. The particular molecules 18 (denoted $R_s$) that are sandwiched at the intersection, or junction, of the two wires 12, 14 are identified as switch molecules. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

Further, FIG. 1B depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$ 18 is formed.

That invention allows electronic devices to be formed with a size on the order of tens of nanometers to a few nanometers simply by making contact between two wires. By choosing the molecules which form a doping layer on the wires (modulation doping), it is possible to build devices with a wide variety of specifically desired electrical properties. The possibility of reversibly or even irreversibly changing the properties of the device via an electrochemical reaction with a large hysteresis loop in its I-V characteristic enables devices to be altered after they are built and may provide new and usefull functions.

The electronic device 10 of that invention, in its simplest state, is a quantum state switch comprising an adjustable tunnel junction 18 between two nanometer-scale wires 12, 14. A plurality of sets of wires, one set configured at an angle to the other, provides a two-dimensional array of switches. The wires are provided with a molecular species 16 at the junctions 18 that, in one embodiment, is bi-stable. The molecule species is addressed by setting voltages on the appropriate two wires. Thus, by the simple process of crossing one type of coated wire over the other, a switch is formed at wherever the intersection occurs; the exact position of the connecting point is not important for this architecture. Furthermore, the chemical species that form the molecular link between the wires can be electrochemically oxidized or reduced. Some types of molecules can be cycled reversibly and others will react irreversibly. The chemical state of the molecular switches determines the tunneling resistance between the two wires, which is exponentially dependent on both the width and the barrier height of the tunneling gap.

An example of a bi-stable molecular switch 110 is shown in FIG. 2, comprising a rotaxane 24. The rotaxane 24 contains two molecular components—a backbone 24a that contains one or more binding sites, and a circular molecule (the 'ring') 24b that fits around the backbone like a ring on a post. The ring 24*b* is in intimate mechanical contact, but is not chemically bonded to the backbone 24*a*. Depending on how the ring is fabricated, the ring may have one or more preferred minimum-energy locations along the backbone. In FIG. 2, these sites are denoted 26 (left site) and 28 (right site).

The moiety 29 on the left side of the rotaxane 24 shows that the molecule is asymmetric and therefore can have different properties when oxidized than when reduced.

Crossbar of the Present Invention

Figure 3:
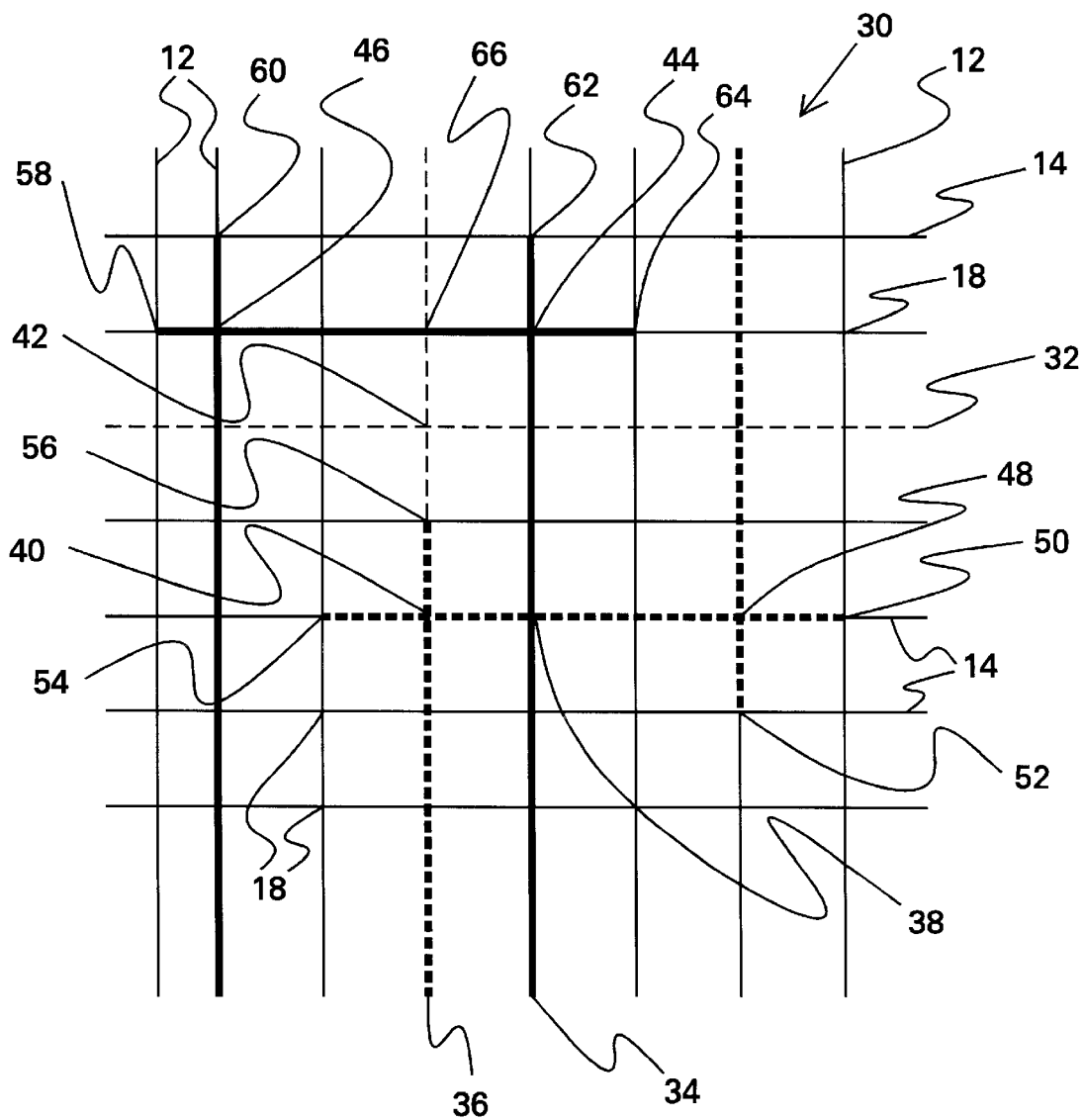
FIG. 3 is a schematic diagram depicting a crossbar interconnect and showing the features that enable construction of an arbitrarily complex integrated circuit.

FIG. 3 presents one embodiment of a crossbar 30 the present invention. The crossbar consists of a layer of vertical nanowires 12 and a layer of horizontal nanowires 14. Junctions 18 are formed where the vertical wires 12 and the horizontal wires 14 cross. Distinct electrical nets (one indicated by dashed lines 32, one indicated by heavy solid lines 34, and one indicated by dotted lines 36) may be created in the crossbar 30 as part of the integrated circuit. These separate circuits 32, 34, 36 can cross each other without being electrically connected where a crossbar switch is open, denoted 38 (not conducting current). Alternatively, horizontal and vertical wires may be electrically connected by switches that are closed, denoted 40, 42, 44, 46, 48. Circuits may be confined to segments of horizontal or vertical crossbar wires by controlled oxidation of a nanowire to make an electrically open switch, denoted 50, 52, 54, 56, 58, 60, 62, 64. By using the voltage across the electrochemical cell formed by each pair of crossed nanowires to make and break electrical connections both along wires in a layer (segmented wires) and between wires in two layers (vias), one can create an integrated circuit of arbitrarily complex topology. The wires may connect to an electronic device (e.g., resonant tunneling diode or transistor) (not shown) external to the crossbar array 30. (The formation of transistors is disclosed and claimed in copending application Ser. No. 09/280,188.) Alternatively, two or more nets, e.g., 32, 34 may connect to an electronic device 66 (e.g., resonant tunneling diode or transistor) internal to the crossbar array 30. In the circuit depicted in FIG. 3, it is to be understood that all pairs of wires 12, 14 which cross will have the switch 18 between them open unless it specifically intended to be closed by the design of the integrated circuit. The freedom of a circuit designer to arbitrarily select the mixture of device types and interconnect topologies (of which FIG. 3 only shows arbitrary examples) makes the present invention valuable.

This freedom to select a mixture of device types and interconnect topologies includes the possibility that the wires 12 in the first layer (and also the wires 14 in the second layer) are heterogeneous in their composition or functionalization. The wires in a given layer can be separately formed and functionalized in a plurality of different ways, and subsequently assembled to form a layer that is heterogeneous in wire type.

While the discussion with respect to FIG. 3 is specifically directed to nanoscale wires (wires having a diameter on the order of nanometers or tens of nanometers), the same considerations may be employed in the utilization of micron-scale wires (wires having a diameter on the order of micrometers or sub-micrometers). In either case, the operation of the junction 18 is dependent on a molecular species, which provides a device that is measured in terms of nanometers in its functional dimension.

Figure 4:
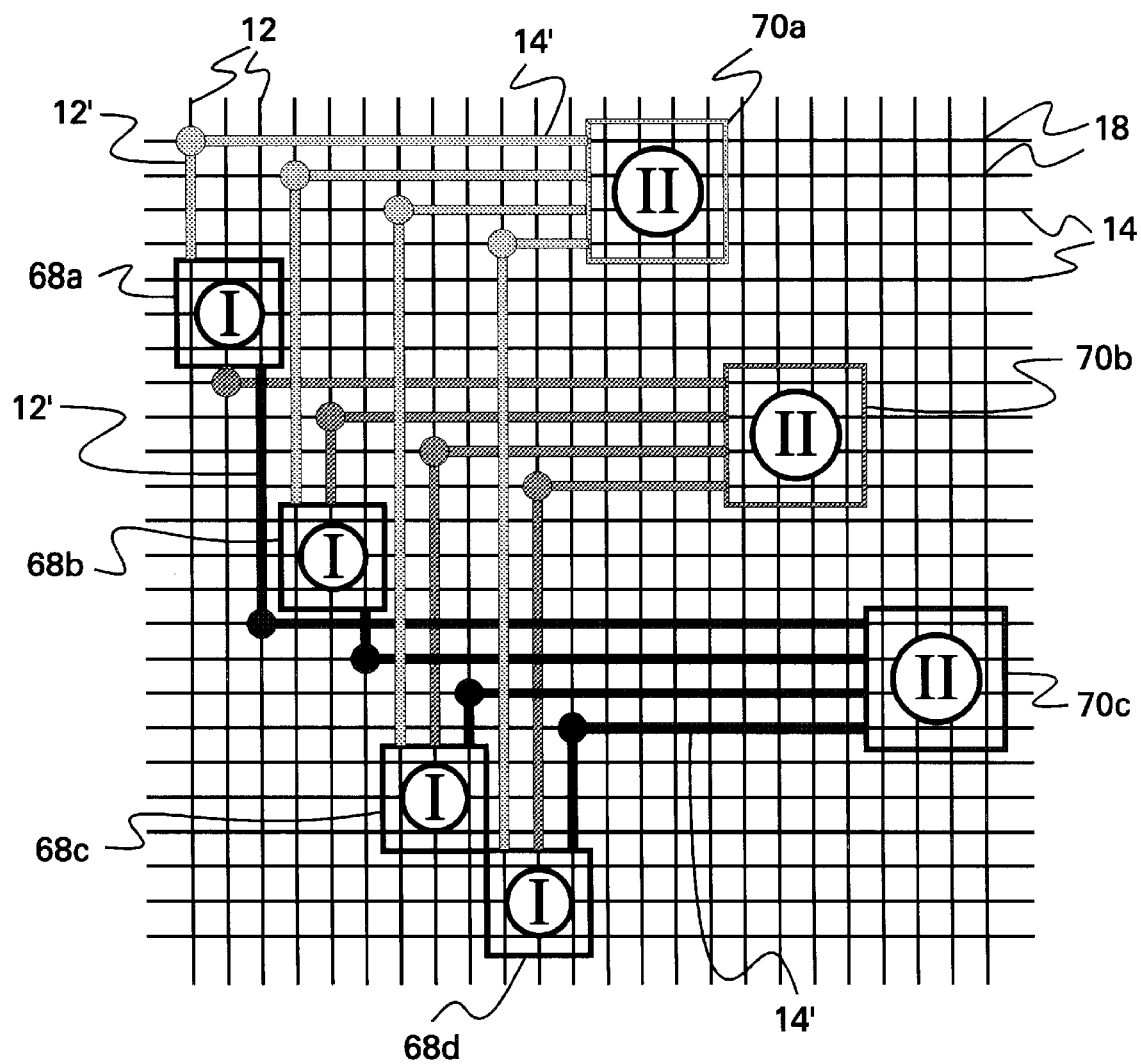
FIG. 4 depicts a scalable, defect-tolerant fat-tree networking scheme with an all-to-all connect between two different levels.

FIG. 4 presents one realization of the present invention that is similar to an architecture recently patented by G. S. Snider, supra. This networking scheme has several advantages. It is scalable to many levels, it is based on a crossbar structure, it is defect-tolerant, and it takes advantage of the fact that molecular scale switches can be fabricated simply by crossing two wires.

Specifically, FIG. 4 depicts a scalable, defect-tolerant, fat-tree networking scheme with an all-to-all connect between two different levels (I and II), in which each group of switches 68*a*, 68*b*, 68*c*, 68*d* in one level is connected to each group of switches 70*a*, 70*b*, 70*c* in the other level. In the all-to-all configuration depicted in FIG. 4, one group of switches in level I, say 68*b*, is connected to all groups of switches in level II (70*a*, 70*b*, 70*c*), and similarly for switch groups 68*a*, 68*c*, and 68*d*.

In this scheme, level-I crossbars, for example, might be configured as a series of adders, while the level-II crossbars are used for communication and routing, or perhaps for generating a multiplier from the adders. This diagram highlights the relative importance of communication and routing in any computer, much less a defect-tolerant molecular computer. The thicker wires 12', 14' are illustrative of pathways that should be considered as "bundles" of wires.

The connections shown in FIG. 4 are a specific case of a means to connect two levels of a fat-tree crossbar hierarchy. It is clear that by extending the method to include a set of level-III crossbars which do not share rows or columns with lower level crossbars, the fat tree can be extended arbitrarily. This method requires only a set of bi-stable switches which can control (make or break) electrical contact in the Z direction (out of the paper) approximately perpendicular to the two parallel planes (X-Y, in the paper) defined by the crossbar wires.

In order to create an arbitrary circuit from a highly ordered set of wires and switches such as a crossbar, it is necessary to make cuts at specific locations to break the electrical continuity along certain wires (in the plane of the crossbar). This enables functions in one part of the regular array of wires and switches to be isolated from those of other parts, and in conjunction with open switches between the two layers of a crossbar allows electrical signals from different finctions to be routed through each other without interfering. Given the fact that the crossbars 30 described herein are made from junctions 18, which are essentially electrochemical cells, between sets of crossing wires, such cuts can be made by over-oxidizing a particular junction to consume a localized region of the wire to be cut, and thus form an insulating gap that breaks the electrical continuity of that wire at the desired location. Thus, there are at least three different voltage levels (which may be different magnitudes of the same polarity or involve different polarities) utilized in configuring a crossbar into a communications interconnect and using it. The first voltage level is relatively large, and it is used only to over-oxidize a junction to create an electrical break in a wire. The next voltage level is smaller in magnitude, and it is used to oxidize or reduce some or all of the molecules or materials between two wires to open or close a switch and thus disable or enable a particular type of connection between the wires in different levels of the crossbar. Finally, the third voltage is the smallest, and that is the voltage level used to actually propagate information through the circuit. The three voltages must be separated enough from each other to avoid unintentional setting of switches or cutting of wires by signal propagation. The values of the three voltages is easily determined without undue experimentation, based on the teachings herein.

The over-oxidation approach is particularly suitable where the wires have a diameter on the order of nanometers or tens of nanometers. However, where the wires have a diameter on the order of micrometers or sub-micrometers, the over-oxidation approach may not be suitable, due to the length of time required to completely oxidize the thicker wire. Accordingly, other approaches may be required for severing the junction between two micrometer-scale wires.

By including switches described in copending patent application Ser. No. 09/280,188 ("Molecular Wire Transistor"), the interconnect can be configured by setting configuration bits which make or break electrical connections along the wires in X-Y plane. This permits formation of a much more compact fat-tree topology shown in the Snider patent, (U.S. Pat. No. 5,519,629, issued to G. S. Snider on May 21, 1996, and assigned to the same assignee).

The molecular wire crossbar switch and the resultant crossbar network built from multiple sets of these switches allows construction of an arbitrarily-designed logic circuit. All of the interconnection required by that logic circuit is at a nanometer scale. In effect, all of the wiring required of a complex integrated circuit can be created by this mechanism without the use of lithography. What makes this possible is that the entire device is chemically assembled. The two sets of molecular wires 12, 14 which cross each other are separately created by a chemical process. They are effectively self-aligning. There are two orthogonal groups of wires, and one set will align and hold the other group of wires in a configuration where they are perpendicular to each other. Because one end of the molecular wires can be functionalized with a specific chemistry, it is possible to position the first set in a parallel configuration using larger scale lithographically to orient the edges of the wires.

The self-alignment of the first set of wires 12 can take place either before or after functionalizing or coating the wires.

The interconnect for routing signals in a computing machine employs a set of crossbars 30 to link the levels of the fat tree together. A crossbar is nothing other than a matrix of switches at the intersections of two intersecting groups of parallel wires (see FIG. 3). This has the significant advantage that one can have a very simple interconnection. Only one memory bit or switch is needed at each point in the array. In the present case, the molecule-wire crossbar (MWC) of FIG. 3 is formed by laying down one set of wires 12, for instance, in a vertical orientation, and then crossing them with their complements (wires 14) in a different orientation, say, horizontal. Wherever two complementary wires cross (at 18), they have the opportunity to form a switch 10. If for any reason they do not form a switch, that is not fatal, since there will be plenty of other switches that can route messages around the defective component. The switches are set (the MWC is configured) by electrochemically oxidizing or reducing a known set of working switches (which are found by rigorous testing such as that defined in U.S. Pat. No. 5,790,771, "Apparatus and Method for Configuring a Reconfigurable Electronic System Having Defective Resources", issued to W. B. Culbertson et al on Aug. 4, 1998, and assigned to the same assignee as the present invention.) at a relatively high potential (e.g., between 0.5 and 1.0 V). However, this process leaves the switches either open or closed as long as the information to be routed through the crossbar is at a voltage lower than that required to set the switch. Thus, for the MWC, only one set of wires is required for both addressing and setting the quantum state switches and transmitting information, instead of the separate address and data lines required by typical field programmable gate arrays (FPGAs) that form the existing art. Also, the circuitry of reconfigurable FPGAs requires six or seven transistors to hold the configuration bit and connect the data lines. Since the molecular switches employed herein are held between the wires in the MWC, it should be a factor of ~50 more efficient (in a relative sense) in its utilization of area than existing FPGA crossbars. Thus, MWCs, employing approximately 10 nm diameter doped silicon wires, will have more than $10^5$ times the absolute area density of switches. For carbon nanotube wires, this ratio increases to $10^7$ higher densities.

The essence of this methodology is that the physical device is first constructed and then programmed with logical design. The physical construction is extremely regular, since the assembly of wires into crossbars is thermodynamically driven. Once the system has self-assembled, a very complex logic design is downloaded electronically by setting the appropriate configuration switches.

The switches 10 between the two sets of wires 12, 14 are self-aligning. The crossbar wires are coated with distinct molecules 20, 22, such that only at the intersection 18 of two wires 12, 14 are the two types of molecules close enough to bridge the gap between the two wires and form a switch 10. The switches can then be electrically set by inducing a chemical reaction between the molecules. A unique switch can be set exclusive of all other switches by applying two different voltages to the two wires that define the switch (the bit and word lines) while holding all other wires at an intermediate voltage. The switches are set by a chemical redox reaction which either happens or does not happen based on applying a fairly large (e.g., 0.5 to 1.0 V) potential between the two crossing wires. Thus, there is no "half select" problem where a single wire can accidentally set or reset a switch. The physical advantages of the MWCI are in its scalability, low power consumption, the fact that the switching elements have well-defined threshold voltages, low sensitivity to fields and temperature, and the read process is non-destructive. It is expected that as this architecture matures, it will eventually utilize carbon nanotubes, which have a diameter of about 1 nm and will certainly define the wiring limit for electronic devices. The MWCI is basically a voltage-controlled device, and therefore the fact that it contains components with relatively large resistance is actually an advantage in terms of power consumption.

Also, the redox reactions that will be utilized as the switching elements at the crosspoints are voltage initiated, with values typically between 0.5 and 1 V. These threshold voltages are so reproducible that the technique of cyclic voltammetry, i.e., measuring the "waves" or steps in the I–V curve for such a redox reaction, has been used by chemists for decades as an analytical technique to determine what types of functional groups are present on an "unknown" molecule.

Also, the size of the voltage required to change the state of the bit means the bit should be stable up to temperatures that would destroy the entire device, so the memory bits themselves will not be the most sensitive component of a system.

Because the device self-assembles at a nanometer scale, one can construct very large numbers (in the trillions or above) of these wires and switches. By carefully choosing the topology that are used in the switches selected, such a device can be configured to any reasonable routing interconnect, which would be typical of a logic circuit. One can compute the required switch closings in a time proportional to N log N, where N is the number of logic elements in the circuit. This crossbar switch has the major advantage that it is defect-tolerant; see, W. B. Culbertson, supra. One can find the defects in this switch network in time O(N), where N is the number of wires and switches in the network. As the device is scaled down in size, it is perfectly reasonable to be able to deal with all of the intrinsic defects that a nanometer scale device is going to have. The device is also scalable to build very large, trillions of components, logic circuits. Because realistic circuits follow Rent's Rule, one can combine multiple crossbars to build an arbitrarily large circuit; see, J.R. Heath et al, supra.

A very important property, required for the defect tolerance of the system, is that the switch be reconfigurable. It must be possible to both set configuration bits and reset them a sufficient number of times to run the defect finding diagnostics. This property permits use of the defect-finding technology in the Culbertson et al patent, supra. The second factor that makes the defect tolerance possible, and thus the successful construction of an interconnection network, is that the area taken up by the switches and the associated configuration bits is coincident with the area of the intersection of two wires. For CMOS circuitry, that area (memory bit plus switch) is an order of magnitude larger than the intersection of two wires. Therefore, an architecture which uses a large number of configuration bits is prohibitively expensive in a conventional integrated circuit process. The network disclosed herein has the same amount of wiring that another interconnect scheme is going to have, but it has vastly more switches than conventional interconnects. It is thus very important if one is to use the defect tolerance properties of the network and also use the ability to compute rapidly a set of switch closings that these switches come without the cost of increasing the area of the interconnect. It should be noted that the molecular configuration bits and switches described above could also be used to construct an interconnect set of crossbars in which the wires were formed by nano-imprint lithography; see, e.g., L. Guo et al, "Nanoscale Silicon Field Effect Transistors Fabricated Using Imprint Lithography, *Applied Physics Letters,* Vol. 71, pp. 1881–1883 (Sep. 29, 1997)).

The resistance of Si nanowires is estimated to be in the range of 1 to 10 MΩ, based on the bulk conductivity of Si, and the doping range is believed to be about $10^{17}$ to $10^{18}$ cm$^{-3}$. This resistance is negligible compared to the approximately 1 GΩ resistance expected from the closed switches (open switches will have a resistance of 3 GΩ or more). This is a high resistance, but the typical capacitance expected for such a system is on the order of attofarads, or $10^{-18}$ farad. Thus, the RC time constant for such a system would be only $10^{-9}$ second, which is still fast compared to conventional CMOS. It is expected that further development will decrease the capacitance a little, since it is constrained by geometry and size, but that the resistance of both the wires and switches can decrease substantially as new materials (e.g., carbon nano-tubes) are used for wires and new molecules are utilized in the switches. Thus, the potential for this technology is for information transfer rates in excess of 1 GHz.

In summary, the crossbar 30 disclosed herein is useful for constructing digital logic circuits, which can have arbitrarily complex logic, at a scale of nanometers using a regular chemical assembly process. Further, it will be appreciated by those skilled in this art that additional sets of wires can be formed on top of the top-most layer 14 and at least one connector species formed at each junction between the top-most layer of wires 14 in the crossbar array 30 and the next layer of wires above it so as to create switches at each such junction. In like manner, additional layers of wires can be formed and connected in the Z direction so as to form a three-dimensional structure.

The technology disclosed and claimed herein for forming integrated circuits from arrays of crossed wires (micrometer or nanometer) may be used to perform a variety of functions and to form a variety of useful devices and circuits for implementing computing on a microscale and even on a nanoscale. For example, a molecular wire crossbar (MWC) memory is disclosed and claimed in related application Ser. No. 09/280,189; molecular wire crossbar logic (MWCL) employing programmable logic arrays is disclosed and claimed in related application Ser. No. 09/280,045; a demultiplexer for a MWC network is disclosed and claimed in related application Ser. No. 09/280,049; and molecular wire transistors are disclosed and claimed in related application Ser. No. 09/280,188, all filed on even date herewith.

Thus, there has been disclosed a device for constructing molecular wire crossbars employing crossed wires joined by bi-stable molecules at the intersecting junctions. It will be apparent to those skilled in this art that various changes and modifications of an obvious nature may be made, and all such changes and modifications are considered to fall within the scope of the appended claims.

What is claimed is:

1. A crossbar array of crossed-wire devices, each device comprising a junction formed by a pair of crossed wires where one wire crosses another and at least one connector species connecting said pair of crossed wires in said junction, said junction having a functional dimension in nanometers, wherein said at least one connector species and said pair of crossed wires form an electrochemical cell, with one set of wires formed above another set of wires.

2. The array of claim 1 wherein said at least one connector species forms a quantum state molecular switch comprising an electrically adjustable tunnel junction between said two wires.

3. The array of claim 1 wherein at least one of said two wires has a thickness that is about the same size as said at least one connector species, and over an order of magnitude longer than its diameter.

4. The array of claim 3 wherein both of said two wires have a thickness that is about the same size as said at least one connector species.

5. The array of claim 1 wherein both of said two wires have a thickness that ranges from sub-micrometer to micrometer.

6. The array of claim 1 wherein said junction is a singly configurable or reconfigurable switch.

7. The array of claim 6 wherein said junction is at least one of elements selected from the group consisting of resistors, tunneling resistors, diodes, tunneling diodes, resonant tunneling diodes, and batteries.

8. The array of claim 1 wherein each said wire independently comprises a conductor or a semiconductor.

9. The array of claim 8 further including an insulating layer or a modulation-doped coating on at least one of said wires.

10. The array of claim 9 wherein said insulating layer comprises an oxide.

11. The array of claim 8 wherein said semiconductor is internally doped.

12. The array of claim 1 wherein said at least one connector species comprises a bi-stable molecule.

13. The array of claim 1 comprising at least one additional set of wires formed above a top-most said set of wires and including at least one connector species between adjacent layers to connect crossed wire pairs.

14. The array of claim 1 employing an array of aligned, chemically-fabricated wires.

15. The array of claim 1 employing an array of nano-imprint, lithographically-formed wires.

16. The array of claim 1 wherein one said set of wires in a given layer is separately formed and functionalized in a plurality of different ways to form said layer that is heterogeneous in wire type.

17. A method of fabricating a crossbar array comprising a plurality of crossed-wire devices, each device comprising a junction formed by (1) a pair of crossed wires where a first wire is crossed by a second wire and (2) at least one connector species connecting said pair of crossed wires in said junction, said junction having a functional dimension in nanometers, wherein said at least one connector species and said pair of crossed wires form an electrochemical cell, said method comprising (a) forming a first set of wires comprising a plurality of said first wires, (b) depositing said at least one connector species over at least a portion of said first set of wires, (c) forming a second set of wires comprising a plurality of said second wires, and (d) assembling said second set of wires over said first set of wires so as to form a said junction at each place where a second said wire crosses a first said wire.

18. The method of claim 17 wherein said at least one connector species forms a quantum state molecular switch comprising an electrically adjustable tunnel junction between said two wires.

19. The method of claim 17 wherein at least one set of said two wires is formed to a thickness that is about the same size as said at least one connector species, and over an order of magnitude longer than its diameter.

20. The method of claim 19 wherein both sets of said two wires are formed to a thickness that is about the same size as said at least one connector species.

21. The method of claim 19 wherein said first set of wires is self-aligned either before or after depositing said connector species thereon.

22. The method of claim 17 wherein both sets of said two wires are formed to a thickness that ranges from sub-micrometer to micrometer.

23. The method of claim 17 wherein said junction forms a singly configurable or reconfigurable switch.

24. The method of claim 23 wherein said junction is at least one of elements selected from the group consisting of resistors, tunneling resistors, diodes, tunneling diodes, resonant tunneling diodes, and batteries.

25. The method of claim 17 wherein each said wire independently comprises a conductor or a semiconductor.

26. The method of claim 25 further including forming an insulating layer or a modulation-doped coating on at least one of said wires.

27. The method of claim 17 wherein said at least one connector species comprises a bi-stable molecule.

28. The method of claim 17 wherein at least one additional set of wires is formed above a topmost said set of wires and at least one connector species is provided between adjacent layers to connect crossed wire pairs.

29. The method of claim 17 wherein said forming of said second set and said assembling takes place substantially simultaneously.

30. The method of claim 17 employing an array of aligned, chemically-fabricated wires.

31. The method of claim 17 employing an array of nano-imprint, lithographically-formed wires.

32. The method of claim 17 wherein said first wires of fist set are aligned either before or after depositing said connector species thereover.

33. The method of claim 17 wherein at least one said set of wires is (a) separately formed and functionalized in a plurality of different ways and (b) subsequently assembled to form a layer that is heterogeneous in wire type.

34. A method of operating a crossbar array comprising a plurality of crossed-wire devices, each device comprising a junction formed by a pair of crossed wires where one wire crosses another and at least one connector species connecting said pair of crossed wires in said junction, said junction having a functional dimension in nanometers, wherein said at least one connector species and said pair of crossed wires forms an electrochemical cell, said method comprising biasing sets of both wires at least once with a first voltage sufficient to cause an electrochemical reaction in said connector species and switch its state.

35. The method of claim 34 wherein said at least one connector species forms a quantum state molecular switch comprising an electrically adjustable tunnel junction between said two wires.

36. The method of claim 34 wherein at least one set of said two wires has a thickness that is about the same size as said at least one connector species, and over an order of magnitude longer than its diameter.

37. The method of claim 36 wherein both sets of said two wires have a thickness that is about the same size as said at least one connector species.

38. The method of claim 34 wherein both sets of said two wires have a thickness that ranges from sub-micrometer to micrometer.

39. The method of claim 34 wherein each said junction forms a singly configurable, which is biased only once, or a reconfigurable switch, which may be biased more than once.

40. The method of claim 39 wherein said at least one connector species comprises a bi-stable molecule.

41. The method of claim 40 wherein each said switch at each said junction is selectively set either closed or open so as to make or break electrical connection between said pair of wires at said junction.

42. The method of claim 39 wherein at least one selected wire within a set of wires is electrically cut at at least one selected location by over-oxidizing a junction to create an electrical break at said location.

43. The method of claim 42 wherein each said junction is over-oxidized by biasing both said wires forming each said junction with a larger voltage that is higher than said first voltage.

44. The method of claim 39 wherein each said junction forms a reconfigurable switch and a scalable, defect-tolerant, fat-tree networking scheme with an all-to-all connect is formed between a first logic level and a second logic level, each logic level comprising at least one group of switches, each group comprising a plurality of said switches, with each group in one logic level connected to all groups in the other logic level.

45. The method of claim 39 wherein said junction is at least one of elements selected from the group consisting of resistors, tunneling resistors, diodes, tunneling diodes, resonant tunneling diodes, and batteries.

46. The method of claim 34 wherein each said wire independently comprises a conductor or a semiconductor.

47. The method of claim 46 further including an insulating layer or a modulation-doped coating on at least one of said wires.

48. The method of claim 34 wherein said at least one connector species is either oxidized or reduced.

49. The method of claim 34 further comprising biasing both wires with a sensing voltage that is of a non-destructive value that does not change the state of said junction.

* * * * *